(12) United States Patent
Kagawa

(10) Patent No.: US 9,235,114 B2
(45) Date of Patent: Jan. 12, 2016

(54) REFLECTIVE MASK AND METHOD FOR MANUFACTURING THE SAME

(71) Applicant: FUJITSU SEMICONDUCTOR LIMITED, Yokohama-shi, Kanagawa (JP)

(72) Inventor: Takeshi Kagawa, Kuwana (JP)

(73) Assignee: FUJITSU SEMICONDUCTOR LIMITED, Yokohama-shi (JP)

( * ) Notice: Subject to any disclaimer, the term of this patent is extended or adjusted under 35 U.S.C. 154(b) by 156 days.

(21) Appl. No.: 14/066,398

(22) Filed: Oct. 29, 2013

(65) Prior Publication Data

US 2014/0127613 A1    May 8, 2014

(30) Foreign Application Priority Data

Nov. 7, 2012    (JP) ................................. 2012-245267

(51) Int. Cl.
*G03F 1/24* (2012.01)
*G03F 1/22* (2012.01)

(52) U.S. Cl.
CPC ........................................ *G03F 1/24* (2013.01)

(58) Field of Classification Search
CPC ..................................... G03F 1/22; G03F 1/24
USPC ...................................................... 430/5, 394
See application file for complete search history.

(56) References Cited

U.S. PATENT DOCUMENTS

2006/0240334 A1*  10/2006  Huh et al. ........................ 430/5
2009/0220869 A1*   9/2009  Takai ............................... 430/5

FOREIGN PATENT DOCUMENTS

JP      2009-212220 A     9/2009

* cited by examiner

*Primary Examiner* — Stephen Rosasco
(74) *Attorney, Agent, or Firm* — Westerman, Hattori, Daniels & Adrian, LLP

(57) ABSTRACT

A reflective mask includes a substrate and a multilayer reflective film formed on the substrate. An absorption pattern is formed on the multilayer reflective film. A recess is formed in the multilayer reflective film in a peripheral region of the absorption pattern.

9 Claims, 12 Drawing Sheets

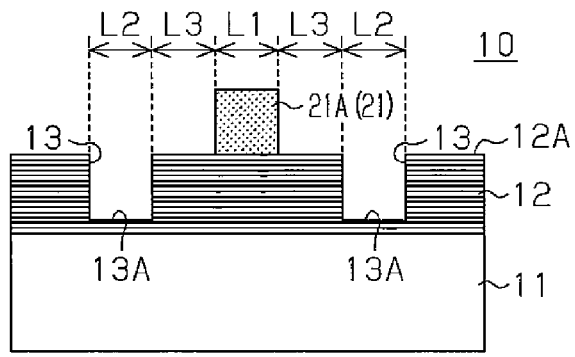
Fig.3
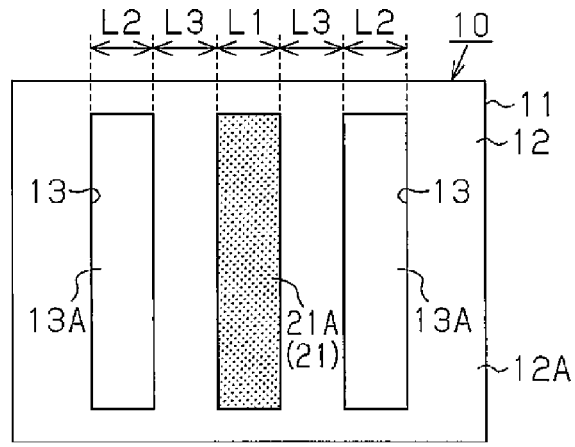
Fig.4
Fig.5
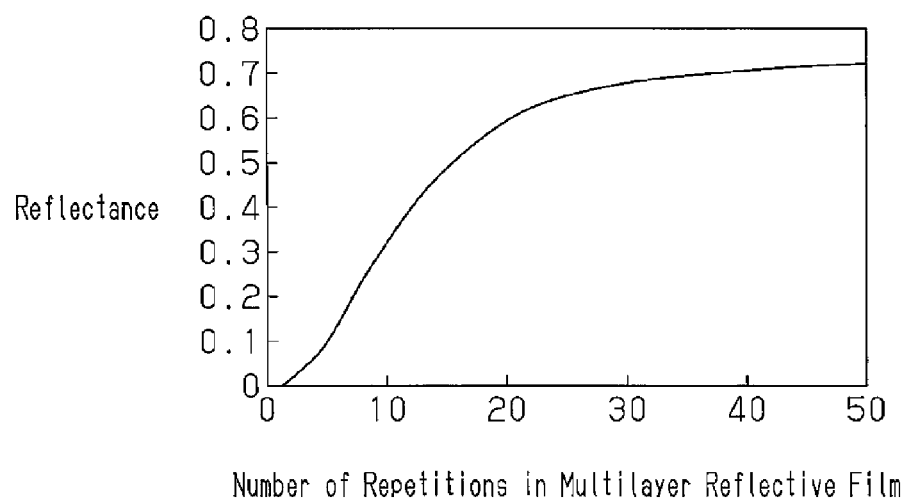
Number of Repetitions in Multilayer Reflective Film

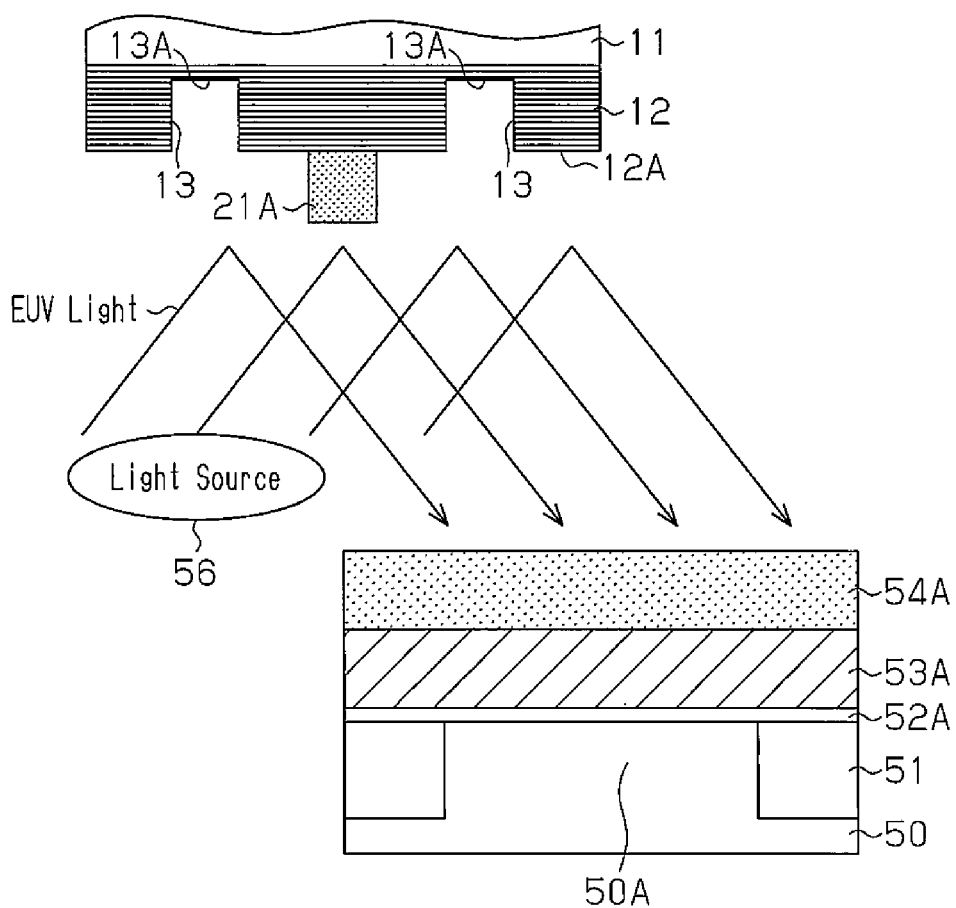

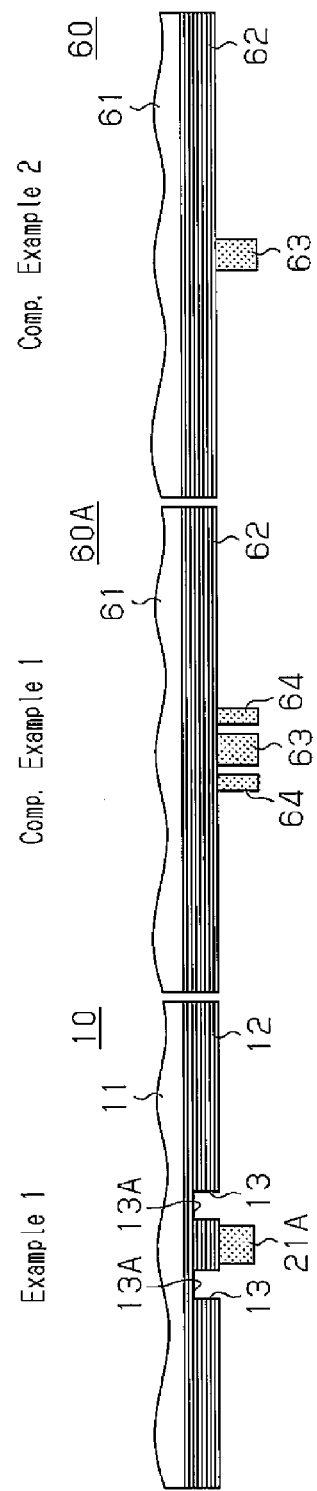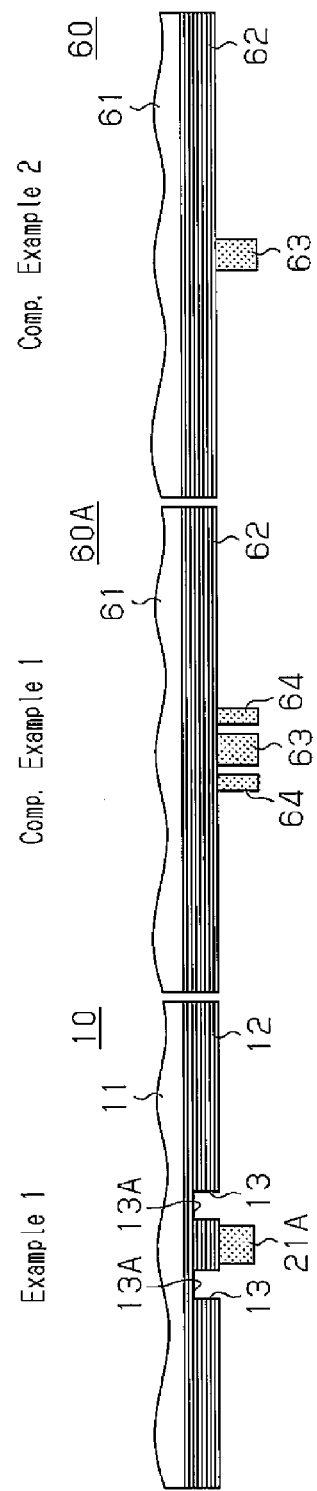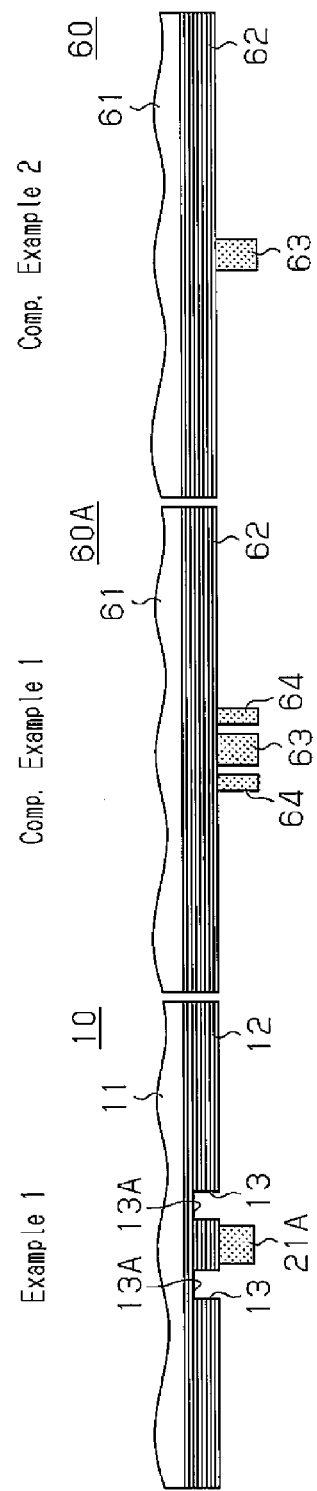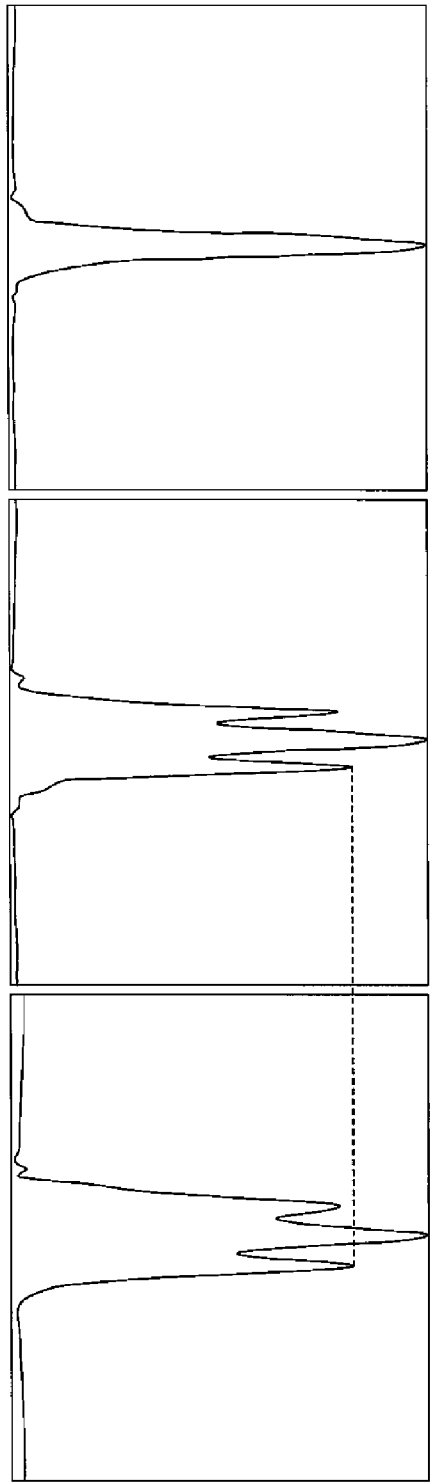

REFLECTIVE MASK AND METHOD FOR MANUFACTURING THE SAME

CROSS-REFERENCE TO RELATED APPLICATIONS

This application is based upon and claims the benefit of priority from prior Japanese Patent Application No. 2012-245267, filed on Nov. 7, 2012, the entire contents of which are incorporated herein by reference.

FIELD

This disclosure relates to a reflective mask and a method for manufacturing the same.

BACKGROUND

In a process of manufacturing a semiconductor device such as a Large Scale Integration (LSI) circuit, a fine circuit pattern is formed on a surface of a semiconductor wafer. A lithography technology is used to form the circuit pattern. In the lithography technology, a photomask (also called a reticle) that is an original plate of a circuit pattern is irradiated with exposure light, whereby the circuit pattern is transferred onto the surface of the semiconductor wafer through a reduction optical system.

In recent years, with increased integration and speed of LSI circuits, further reduction in the size of the circuit pattern is rapidly being progressing. To increase the resolution of lithography, Japanese Laid-Open Patent Publication No. 2009-212220 describes extreme ultraviolet (EUV) lithography in which EUV light having a wavelength of approximately 3 nm to 30 nm is used as a light source. In the EUV lithography, a reflective mask is used because a significant decrease in intensity of the EUV light occurs when using a transmissive mask such as a glass reticle.

A Mask blank that is used to form a reflective mask includes a multilayer reflective film and an absorption layer that are stacked on a glass substrate, such as quartz glass or low thermal expansion glass substrate. The multilayer reflective film has a high reflectance to the wavelength of an exposure light source. The absorption layer absorbs the EUV light used as exposure light. The absorption layer of the mask blank is partially removed through electron beam lithography and etching to form an absorption pattern. The absorption pattern and the multilayer reflective film form a desired circuit pattern. The EUV light is absorbed by the absorption pattern and is reflected by the multilayer reflective film in a part in which the absorption layer is removed. As a result, an optical image reflected by the reflective mask is transferred on a semiconductor wafer after passing through a reflection optical system.

In lithography, the finer the circuit pattern, the lower the uniformity of dimensions. One of factors of decreasing the uniformity of dimensions is a focus error (variation in focus) in an exposure apparatus. Such a focus error causes a pattern formed to have a variation in dimensions. In particular, in an isolated pattern (non-dense pattern) having a narrow focus margin and a small depth of focus (DOF), a variation in dimensions caused by a variation in focus greatly appears. This may cause a significant reduction in width dimension. Further, in the EUV lithography, when the size of the isolated pattern is reduced, a variation in dimensions significantly appears.

SUMMARY

One aspect of this disclosure is a reflective mask. The reflective mask includes a substrate, a multilayer reflective film formed on the substrate, an absorption pattern formed on the multilayer reflective film, and a recess formed in the multilayer reflective film in a peripheral region of the absorption pattern.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory and are not restrictive of the invention, as claimed.

BRIEF DESCRIPTION OF THE DRAWINGS

The embodiment, together with objects and advantages thereof, may best be understood by reference to the following description of the presently preferred embodiments together with the accompanying drawings in which:

FIG. 3 is a partially enlarged sectional view illustrating part of the reflective mask of FIG. 1;

FIG. 4 is a partially enlarged plan view illustrating part of the reflective mask of FIG. 1;

FIG. 5 is a graph illustrating a relationship between the number of repetitions and reflectance of a multilayer reflective film;

FIGS. 8, and 9A to 9D are schematic diagrams illustrating an example of application of the reflective mask of FIG. 1 to a method for manufacturing a semiconductor device;

FIGS. 14A to 14C are diagrams illustrating results of simulation of optical intensity;

DESCRIPTION OF THE EMBODIMENTS

One embodiment will now be described with reference to FIGS. 1 to 16.

Figure 1:
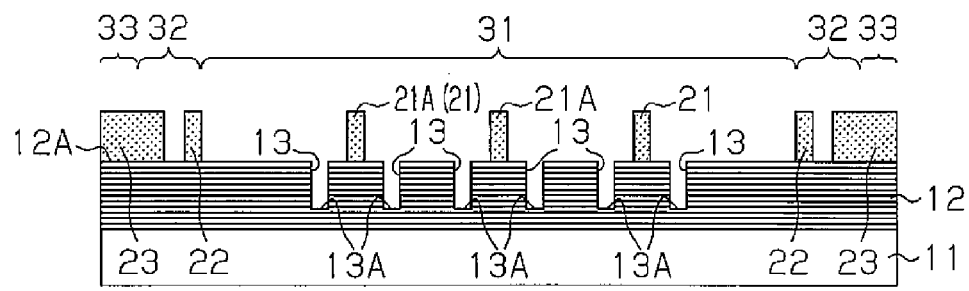
FIG. 1 is a schematic sectional view illustrating a reflective mask according to one embodiment.

As illustrated in FIG. 1, a reflective mask 10 includes a substrate 11, a multilayer reflective film 12 arranged on an upper surface of the substrate 11, and absorption patterns 21, 22, and 23 formed on the multilayer reflective film 12. The multilayer reflective film 12 has a high reflectance to the wavelength (for example, 13 nm to 14 nm) of EUV light. The absorption patterns 21 to 23 are layers that absorb (block) the EUV light. It is preferable that the material for the substrate 11 be a material having a low thermal expansion coefficient (for example, a range of approximately $0 \pm 1.0 \times 10^{-7}$/C) and high smoothness and flatness. For example, a low thermal expansion glass (such as $SiO_2$—$TiO_2$ glass) or quartz glass is usable as the material for the substrate 11.

The multilayer reflective film 12 has a reflectance of approximately 60 to 70% with respect to EUV light having a wavelength of approximately 13 nm to 14 nm. As the multilayer reflective film 12, a reflective film formed by cyclically stacking elements having different refractive indices may be used. For example, as the multilayer reflective film 12, a multilayer reflective film may be used which is formed by alternately stacking a thin film of a heavy element layer or heavy element compound layer and a light element layer or light element compound layer in approximately 40 to 60 cycles (pairs). For example, as the multilayer reflective film 12, an Mo/Si multilayer film is preferably used which is formed by alternately stacking a molybdenum (Mo) layer and a silicon (Si) layer in approximately 40 cycles. In other words, as the multilayer reflective film 12, an Mo/Si multilayer film formed by a total of approximately 80 Mo and Si layers may be used. Here, the thickness of a one-layer Mo film may be set to, for example, approximately 2.9 nm, while the thickness of a one-layer Si film may be set to, for example, approximately 4.0 nm. The types of the multilayer reflective film 12 when it is used in the wavelength region of EUV light include, for example, a ruthenium (Ru)/Si multilayer film, an Mo/beryllium (Be) multilayer film, an Mo compound/Si compound multilayer film, an Si/niobium (Nb) multilayer film, an Si/Mo/Ru multilayer film, an Si/Mo/Ru/Mo multilayer film, and an Si/Ru/Mo/Ru multilayer film.

The absorption patterns 21 to 23 each have a reflectance of approximately 0 to 20% with respect to EUV light having, for example, a wavelength of approximately 13 nm to 14 nm. The materials usable for the absorption patterns 21 to 23 contain, for example, tantalum (Ta), a tantalum boron alloy (TaB), tantalum nitride (TaN), and chrome (Cr). Tantalum has high processability as it has a large EUV light absorption coefficient and may easily be dry-etched with chlorine. A tantalum boron alloy has an advantage in that, in addition to the advantage of tantalum, a film having high flatness may be obtained since the alloy is easily subjected to amorphization. Further, a tantalum boron alloy is a material with which high dimension accuracy of the mask pattern may be realized as the alloy has high controllability of film stress. The absorption patterns 21 to 23 each have a thickness enough to absorb the EUV light used as exposure light. The thickness of each of the absorption patterns 21 to 23 may be set to, for example, approximately 30 nm to 100 nm.

Figure 2:
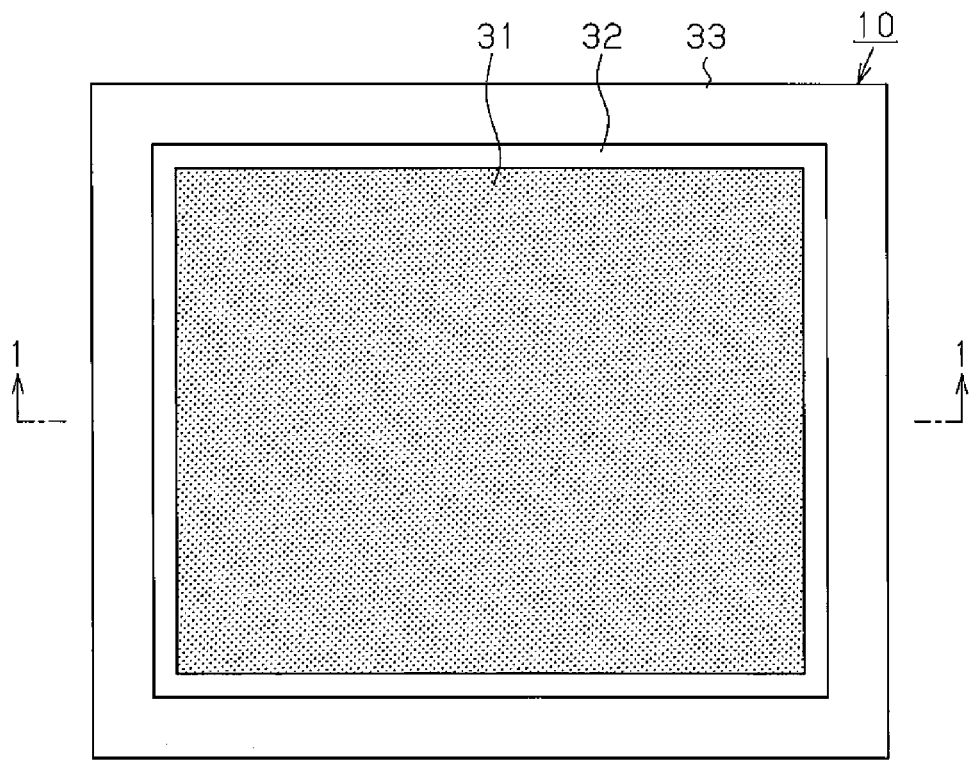
FIG. 2 is a schematic plan view illustrating the reflective mask of FIG. 1.

As illustrated in FIG. 2, the reflective mask 10 (the substrate 11) includes a circuit pattern region 31, a scribe region 32, and a shield region 33. The circuit pattern region 31 is formed substantially in the center of the reflective mask 10 as viewed from above. The scribe region 32 is formed in a frame shape to surround the circuit pattern region 31. The shield region 33 is formed in a frame shape to surround the scribe region 32. The scribe region 32 is arranged outside the circuit pattern region 31, and the shield region 33 is arranged outside the scribe region 32. As illustrated in FIG. 1, the absorption patterns 21 are formed in the circuit pattern region 31, the absorption patterns 22 are formed in the scribe region 32, and the absorption pattern 23 is formed in the shield region 33.

In the scribe region 32, patterns, such as an alignment mark for flowing a lot, a process monitor, and the like, are formed. In the shield region 33, the absorption pattern 23 covers the entirety of an upper surface 12A of the multilayer reflective film 12 formed in the shield region 33. In other words, the absorption pattern 23, which functions as a shield film, is formed in the entire surface of the shield region 33.

Circuit patterns are formed in the circuit pattern region 31. Each circuit pattern is formed by the absorption pattern 21 having a desired pattern shape and a part of the multilayer reflective film 12 exposed from the absorption pattern 21. In other words, each of the absorption patterns 21 is patterned to have a shape (planar shape) corresponding to the desired circuit pattern. FIG. 1 illustrates particular absorption patterns 21A among the absorption patterns 21 formed in the circuit pattern region 31. The particular absorption patterns 21A correspond to circuit patterns arranged at large pattern intervals (pitches), for example, at a pitch of 352 nm or greater (88 nm or greater in the wafer scale). The absorption pattern arranged at such a large pitch is hereinafter referred to as a "non-dense pattern".

Next, the absorption pattern 21A and its peripheral structure will now be described. Firstly, the non-dense pattern of the related art will be described. However, the present embodiment is not limited to be applied to the non-dense pattern and may be applied to a pattern of which the pattern interval (pitch) is equal to or less than the above value.

Figure 10A:
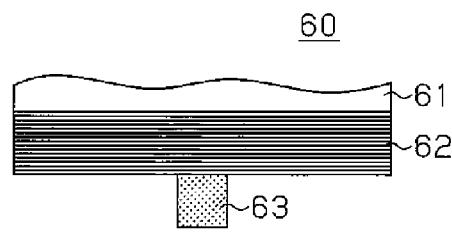
FIGS. 10A to 10D are schematic diagrams illustrating a reflective mask of the related art.
Figure 10B:
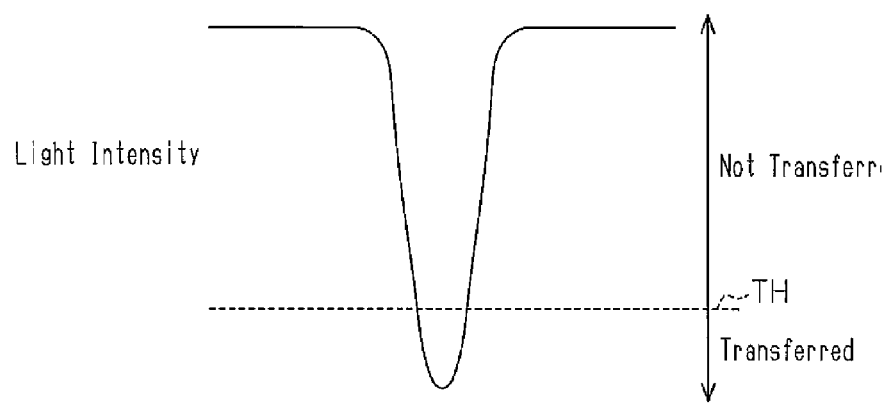
Figure 10C:
Figure 10D:
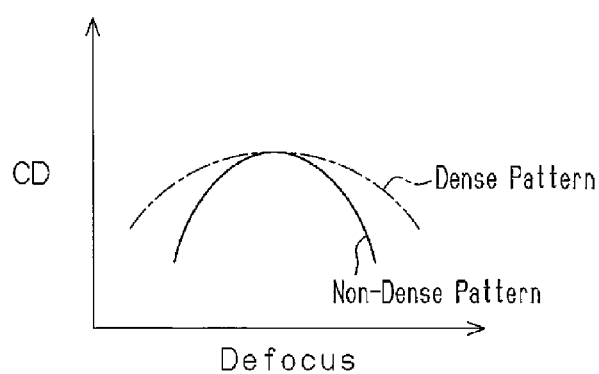

FIG. 10A illustrates a reflective mask 60 of the related art that includes a multilayer reflective film 62 stacked on a substrate 61 and a non-dense pattern 63 formed on the multilayer reflective film 62. FIG. 10B illustrates an optical intensity distribution when exposure is performed using the reflective mask 60 illustrated in FIG. 10A. In the optical intensity distribution, a convex peak appears at a position corresponding to the non-dense pattern 63, that is, in the center. FIG. 10C illustrates a resist pattern 71 obtained by exposing and developing a resist film, formed on an upper surface of a semiconductor wafer 70, using the reflective mask 60 of FIG. 10A. Here, a positive resist film in which an unexposed portion is left as the resist pattern 71 is used. A portion exposed by exposure light having an intensity lower than a threshold value (critical value) TH illustrated in FIG. 10B becomes an unexposed portion. In other words, when the resist exposed in the optical intensity distribution illustrated in FIG. 10B is developed, a portion exposed by exposure light having an intensity exceeding the threshold value TH is formed as an opening of the resist pattern 71. As a result, as illustrated in FIG. 10C, the non-dense pattern 63 illustrated in FIG. 10A is transferred onto the resist, whereby one resist pattern 71 corresponding to the non-dense pattern 63 is formed on the semiconductor wafer 70. FIG. 10D illustrates a critical dimension (CD) to focus curve (see the solid line) in the non-dense pattern 63 and a CD-to-focus curve (see the dash-dotted line) in a dense pattern. The dense pattern corresponds to a circuit pattern (i.e., a densely formed circuit pattern) having a small pattern interval (pitch).

The CD-to-focus curve makes it possible to know influence of a change in depth of focus (DOF) on the dimensions (dimensions of the resist pattern 71) of the pattern formed on the semiconductor wafer 70. In the graph of FIG. 10D, the vertical axis indicates a resulting line width (critical dimension (CD)) of the pattern transferred onto the resist. The horizontal axis indicates a shift in focus when the pattern is exposed. In the dense pattern where the inclination of an upwardly convex parabola is relatively gradual, the depth of focus is relatively wide and the focus margin is relatively large. Conversely, in the non-dense pattern where the inclination of an upwardly convex parabola is relatively steep, the depth of focus is relatively narrow and the focus margin is relatively small. In other words, compared with the dense pattern, the non-dense pattern has a narrower depth of focus and a smaller focus margin. Thus, in the non-dense pattern, the resist dimensions greatly change in accordance with a change in focus.

A focus value corresponding to the apex of the parabola is called the best focus. In general, the resist dimensions at the best focus are the largest. In considering the depth of focus, a focus range in which 90% or greater of dimensions is obtained with respect to the resist dimensions at the best focus is used as an effective depth of focus.

As one method for increasing the depth of focus and the focus margin in EUV lithography, the sub-resolution assist feature (SRAF) technology used in conventional lithography may be utilized to form an auxiliary pattern.

Figure 11A:
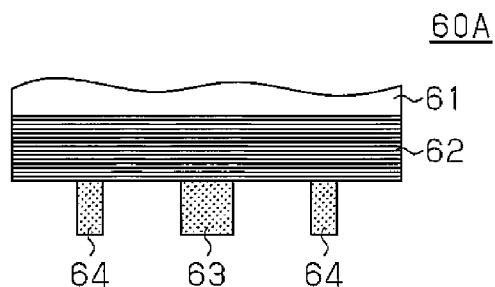
FIGS. 11A to 11D are schematic diagrams illustrating the operation of the reflective mask of the related art in a case where the sub-resolution assist feature (SRAF) technology is applied to the reflective mask.
Figure 11B:
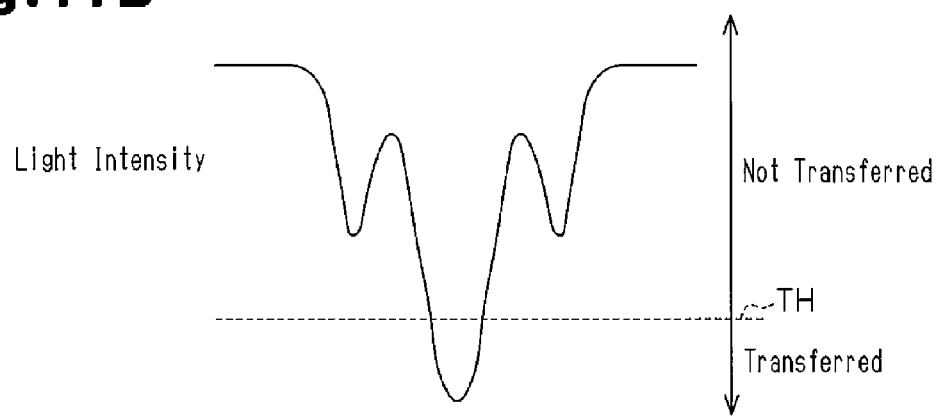
Figure 11C:
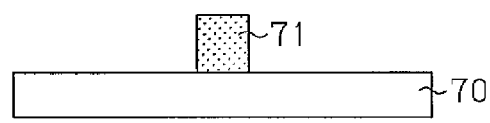
Figure 11D:
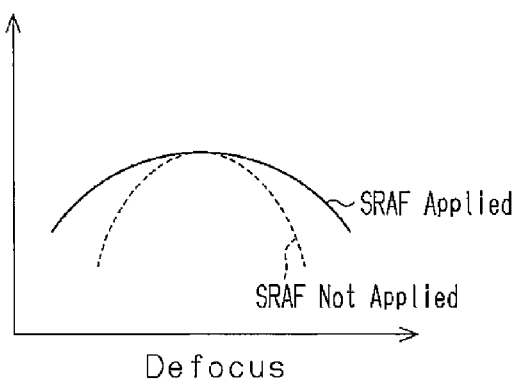

As illustrated in FIG. 11A, with the SRAF technology, auxiliary patterns (SRAF) 64 are formed in a peripheral region of the non-dense pattern 63 (main pattern). The auxiliary patterns 64 are not included in a desired circuit pattern to be formed. In the SRAF technology, the auxiliary patterns 64 are not resolved. That is, the auxiliary patterns 64 are formed in such a size that it is not resolved by an exposure apparatus. As illustrated in FIG. 11B, when a mask 60A including the auxiliary patterns 64 is used for exposure, the optical intensity distribution includes a first downwardly convex large peak that appears at a position (the center) corresponding to the non-dense pattern 63, and two second downwardly convex relatively small peaks that appear in correspondence with the auxiliary patterns 64 on both sides of the first peak. The size of the auxiliary patterns 64 is set to be smaller than that of the non-dense pattern 63 so that the second peaks corresponding to the auxiliary patterns 64 are not lower than the threshold value TH. The auxiliary patterns 64 are formed to be smaller than the non-dense pattern 63 (main pattern). Thus, the optical intensity peaks that appear in correspondence with the auxiliary patterns 64, that is, the second peaks are smaller than an optical intensity peak that appears in correspondence with the non-dense pattern 63, that is, the first peak. When the resist exposed in the optical intensity distribution is developed, the auxiliary patterns 64 are not transferred onto the resist, so that only the non-dense pattern 63 is transferred onto the resist. Thus, as illustrated in FIG. 11C, only one resist pattern 71 corresponding to the non-dense pattern 63 is formed on the semiconductor wafer 70. FIG. 11D illustrates the CD-to-focus curve in the non-dense pattern 63 with the auxiliary patterns 64 (see the solid line: the SRAF applied) and the CD-to-focus curve in the non-dense pattern illustrated in FIG. 10D (see the broken line: the SRAF not applied). As is apparent from FIG. 11D, the arrangement of the auxiliary patterns 64 causes the inclination of the upwardly convex parabola to be gradual, thereby increasing the depth of focus and the focus margin.

In this manner, by applying the SRAF technology to EUV lithography, a depth of focus and a focus margin may be increased. However, in actual EUV lithography, the size of the non-dense pattern 63 (main pattern) is significantly smaller than that in general lithography. Thus, it is very difficult to form a mask including the auxiliary patterns 64 that are smaller than the non-dense pattern 63 and that are not to be resolved. Therefore, in order to form the auxiliary patterns 64, which are smaller than the non-dense pattern 63 and which are not to be resolved, manufacturing costs may greatly increase.

As illustrated in FIG. 3, the reflective mask 10 of the present embodiment includes a plurality of recesses 13 formed in a peripheral region (the vicinity) of the absorption pattern 21A instead of the auxiliary pattern 64 described above. The width of each recess 13 may be enlarged than that of each auxiliary pattern 64 illustrated in FIG. 11A. For example, the width of the recess 13 may be the same as that of the absorption pattern 21A. The recesses 13 are formed in the multilayer reflective film 12 exposed partially from the absorption pattern 21 in the peripheral region of the absorption pattern 21A. The recesses 13 are formed from the upper surface 12A of the multilayer reflective film 12 to an intermediate position in the thickness direction of the multilayer reflective film 12. In other words, each recess 13 includes a bottom 13A positioned at an intermediate position in the thickness direction of the multilayer reflective film 12. The recesses 13 increase the depth of focus and the focus margin in the absorption pattern 21A. Thus, the recesses 13 have a function similar to that of the auxiliary patterns 64. Since the recess 13, which is equivalent in size to the absorption pattern 21A, has a function similar to that of the auxiliary pattern 64, the SRAF technology is applicable to the reflective mask 10 at processing accuracy equivalent to that in the case of processing the absorption pattern 21A.

Next, the structures of the absorption pattern 21A and the recesses 13 will now be described in detail.

As illustrated in FIG. 4, for example, the absorption pattern 21A is formed in substantially rectangular form as viewed from above. The absorption pattern 21A has a width L1 of, for example, approximately 65 nm to 120 nm (approximately 16 nm to 30 nm in the wafer scale). The recesses 13, which are substantially rectangular as viewed from above, are formed on both sides of the absorption pattern 21A. The recesses 13 are formed so as not to be resolved by the exposure apparatus. In other words, a position at which each recess 13 is formed as well as a width L2 and a depth of each recess 13 are set so that the recess 13 is not resolved by the exposure apparatus.

For example, the width L2 of the recess 13 may be set equivalently to the width L1 of the absorption pattern 21A. Alternatively, the width L2 of the recess 13 may be set to be approximately 0.8 to 1.5 times the width L1 of the absorption pattern 21A. That is, the width L2 of the recess 13 may be set to be, for example, approximately 72 nm to 128 nm (approximately 18 nm to 42 nm in the wafer scale).

Each recess 13 is formed at a position spaced apart from the absorption pattern 21A (main pattern) by a distance L3. That is, the recess 13 and the absorption pattern 21A are spaced apart from each other by the distance L3. The distance L3 may be set to be equivalent to the width L1 of the absorption pattern 21A or the width L2 of the recess 13. For example, the distance L3 may be set to approximately 72 nm to 128 nm (approximately 18 nm to 42 nm in the wafer scale).

In FIG. 3, a depth from the upper surface 12A of the multilayer reflective film 12 through the bottom 13A of the recess 13 is set so that a reflectance of the EUV light at the bottom 13A of the recess 13 is less than a reflectance of the EUV light (approximately 60 to 70%) at the upper surface 12A of the multilayer reflective film 12 and is greater than a reflectance of the EUV light (approximately 0 to 20%) at the upper surface of the absorption pattern 21A. For example, the depth of the recess 13 is set so that the reflectance of the EUV light at the bottom 13A is approximately 40 to 50%.

As illustrated in FIG. 5, when the number of layers in the multilayer reflective film 12, that is, the number of repetitions (the number of cycles) of Mo/Si layers changes, the reflectance of the EUV light at the multilayer reflective film 12 changes. The less the number of repetitions of Mo/Si layers in the multilayer reflective film 12, the smaller the reflectance of the EUV light at the multilayer reflective film 12. In view of this, in the reflective mask 10 of the present embodiment, the recesses 13 are formed in the multilayer reflective film 12, as illustrated in FIG. 3. By forming the recesses 13, the number of repetitions of Mo/Si layers in the multilayer reflective film 12 is reduced and the reflectance of the EUV light at the bottom 13A of the recess 13 is reduced than that at the upper surface 12A of the multilayer reflective film 12. For example, the recess 13 is formed by removing (reducing) Mo/Si layers corresponding to approximately 25 to 30 cycles from the upper surface 12A of the multilayer reflective film 12 so that the number of repetitions of Mo/Si layers is 10 to 15. This achieves a reflectance of the EUV light of approximately 40 to 50% at the bottom 13A of the recess 13 (see FIG. 5).

Figure 6:
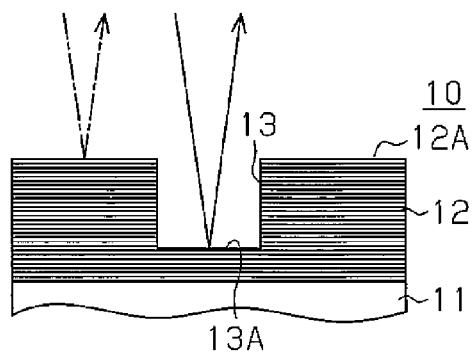
FIG. 6 is a schematic sectional view illustrating the relationship between the number of repetitions and reflectance of the multilayer reflective film.

Further, as illustrated in FIG. 6, when the recess 13 is formed in part of the multilayer reflective film 12, a step is formed between the bottom 13A of the recess 13 and the upper surface 12A of the multilayer reflective film 12. Then, an optical path length (see the solid line) caused by the bottom 13A is longer than an optical path length (see the dash-dotted line) caused by the upper surface 12A. This generates a phase difference (phase shift) between light emitted from the upper surface 12A of the multilayer reflective film 12 to the exterior (the upper side in FIG. 6) of the reflective mask 10 and light emitted from the bottom 13A of the recess 13 to the exterior of the reflective mask 10. Thus, by forming the recess 13 in the multilayer reflective film 12, the reflectance of the EUV light at the bottom 13A of the recess 13 may be reduced.

Although, in the present embodiment, the recesses 13 are formed only on both sides of the absorption pattern 21A, the recesses 13 may be formed so as to surround four sides of the absorption pattern 21A, for example.

Next, the operation of the reflective mask 10 will now be described with reference to FIGS. 7A to 7D.

Figure 7A:
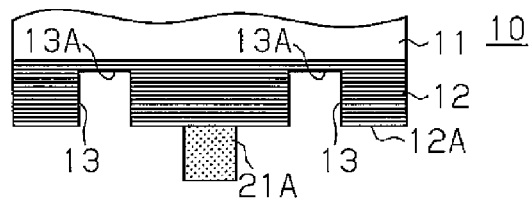
FIGS. 7A to 7D are schematic diagrams illustrating the operation of the reflective mask of FIG. 1.
Figure 7B:
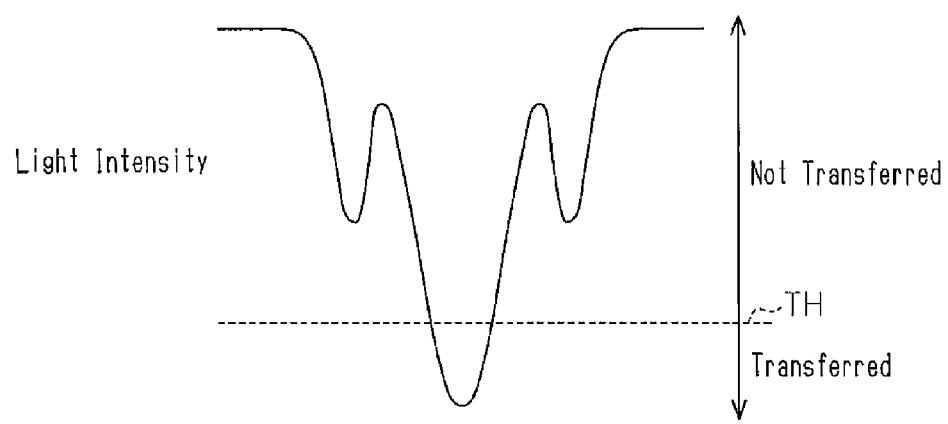
Figure 7C:
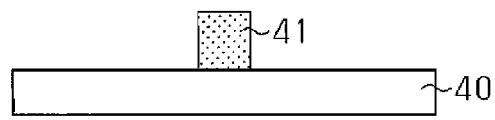
Figure 7D:
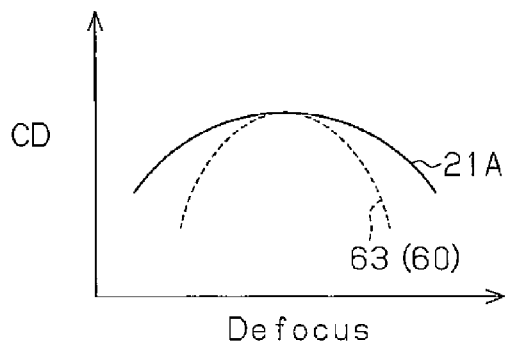

FIG. 7A illustrates the reflective mask 10 illustrated in FIG. 3 with it vertically inverted. FIG. 7B illustrates an optical intensity distribution obtained when the reflective mask 10 illustrated in FIG. 7A is used for exposure. FIG. 7C illustrates a resist pattern 41 obtained by exposing and developing a resist, which is formed on the semiconductor wafer 40, using the reflective mask 10 illustrated in FIG. 7A. FIG. 7D illustrates a CD-to-focus curve (see the solid line) in the absorption pattern 21A with the recesses 13 and a CD-to-focus curve (see the broken line) in the absorption pattern illustrated in FIG. 10D (i.e., the non-dense pattern 63 when the auxiliary pattern (SRAF) 64 and the recess 13 are not formed).

The optical intensity distribution illustrated in FIG. 7B includes a downwardly convex large peak (first peak) appearing at a position (the center) corresponding to the absorption pattern 21A and two downwardly convex relatively small peaks (second peaks) appearing on both sides of the first peak. Here, the reflectance at the bottom 13A of the recess 13 is set to be lower than that at the upper surface 12A of the multilayer reflective film 12 and to be higher than that at the upper surface of the absorption pattern 21A. Thus, the second peaks corresponding to the recesses 13 are smaller than the first peak corresponding to the absorption pattern 21A. In the reflective mask 10, the width, formation position, and depth of each recess 13 are set so that the recesses 13 are not transferred onto the resist, that is, so that the optical intensity peaks (second peaks) appearing in correspondence with the recesses 13 are not lower than the threshold value TH. By forming the recesses 13, as illustrated in FIG. 7B, an optical intensity distribution that is similar to the optical intensity distribution (see FIG. 11B) obtained when the auxiliary patterns 64 are arranged is obtained. When the resist exposed in the optical intensity distribution illustrated in FIG. 7B is developed, a portion exposed by exposure light having an intensity exceeding the threshold value TH is formed as an opening of the resist pattern. Thus, as illustrated in FIG. 7C, the recesses 13 are not transferred onto the resist, so that only the absorption pattern 21A is transferred onto the resist. As a result, a resist pattern 41 corresponding to the absorption pattern 21A is formed on the semiconductor wafer 40. Further, since, by forming the recesses 13, an optical intensity distribution similar to that obtained when the auxiliary patterns 64 are arranged is obtained, as illustrated in FIG. 7D, an upwardly convex parabola in CD-to-focus curve has a gradual inclination as compared with a case (see the broken line) where the auxiliary patterns 64 or the recesses 13 are not formed. Thus, by forming the recesses 13, the depth of focus and the focus margin of the corresponding absorption pattern 21A may be increased. That is, like the auxiliary patterns 64, the recesses 13 formed in the peripheral region of the absorption pattern 21A cause a decrease in the reflectance of the EUV light.

Next, an example of application of the reflective mask 10 to a method for manufacturing a semiconductor device will now be described with reference to FIGS. 8 and 9A to 9D. Here, a pattern to be transferred by the absorption pattern 21A is a gate pattern 53. A case where the gate pattern 53 is formed on a silicon substrate 50 (semiconductor wafer) including an active region 50A defined by an element separation insulation film 51 will be described.

Figure 9A:
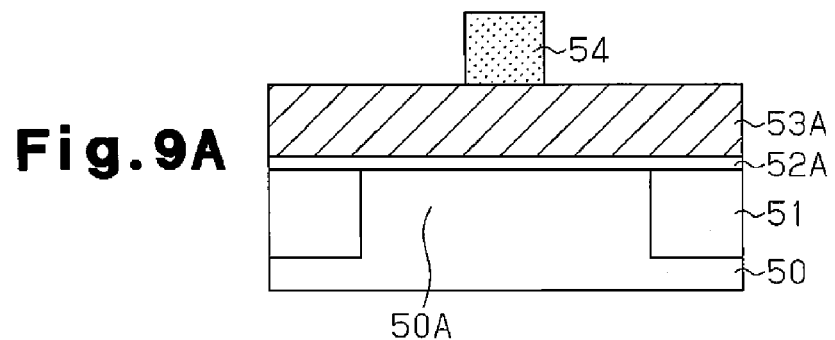
Figure 9B:
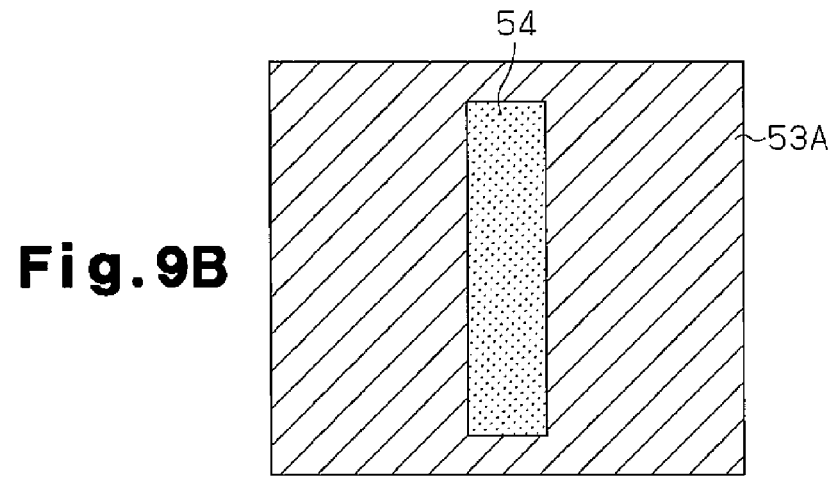

As illustrated in FIG. 8, a gate electrode film 53A is formed via a gate insulation film 52A on the silicon substrate 50. A resist film 54A is formed on the entire upper surface of the gate electrode film 53A. When the resist film 54A is patterned to have a desired shape, the reflective mask 10 is used. In other words, the resist film 54A formed on the gate electrode film 53 is exposed by using the reflective mask 10. As illustrated in FIG. 8, a light source 56 emits EUV light to the reflective mask 10 at an angle of incidence that is inclined by a given angle (for example, approximately 6°) from a vertical direction with respect to an irradiation surface of the reflective mask 10 (the upper surface 12A of the multilayer reflective film 12 and the bottom 13A of the recess 13), and the resist film 54A is exposed by the light reflected by the reflective mask 10. As the resist film 54A, a positive resist film in which an unexposed portion is left as a pattern is used. Thus, by developing the resist film 54A exposed with the reflective mask 10, the absorption pattern 21A of the reflective mask 10 is transferred onto the resist film 54A. As a result, as illustrated in FIGS. 9A and 9B, a resist pattern 54 having a shape (i.e., a substantially rectangular shape as viewed from above) corresponding to the absorption pattern 21A is formed on the gate electrode film 53A. Here, since the recesses 13 of the reflective mask 10 illustrated in FIG. 8 are formed so as to be equal to or less than a resolution limit, the recesses 13 are not transferred onto the resist film 54A. Further, since the recesses 13 are formed together with the absorption pattern 21A, the depth of focus and the focus margin of the absorption pattern 21A may be increased. Accordingly, the size (ling width) of the resist pattern 54, which corresponds to the absorption pattern 21A, may be prevented from having a variation.

Figure 9C:
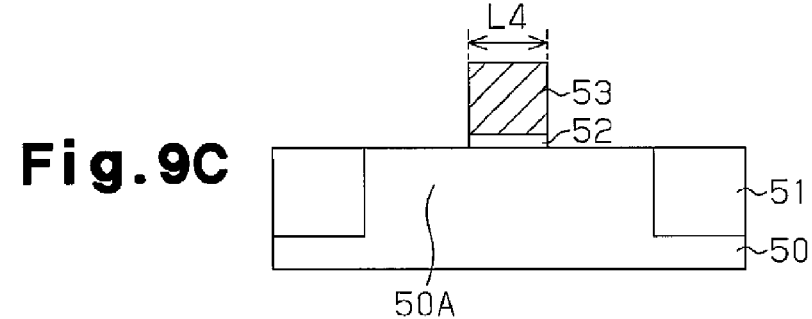
Figure 9D:
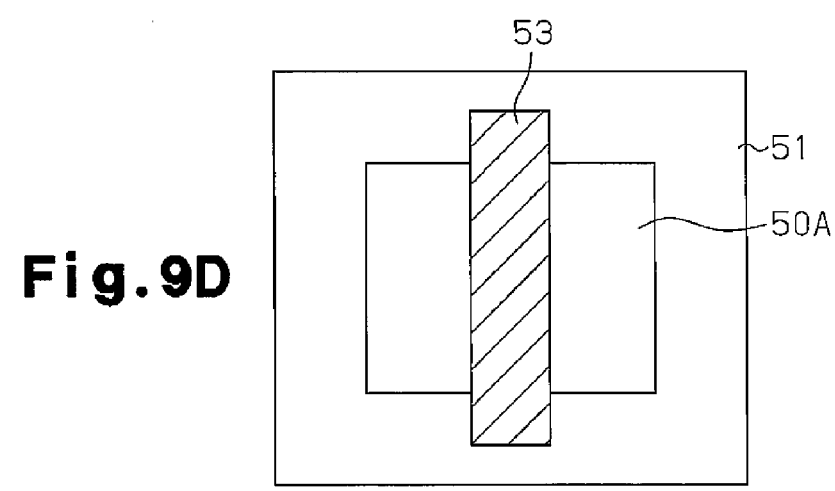

Next, by using the resist pattern 54 as an etching mask, the gate electrode film 53A and the gate insulation film 52A are etched until the element separation insulation film 51 and the active region 50A are exposed. As a result, as illustrated in FIGS. 9C and 9D, the gate pattern 53 and the gate insulation film 52 are formed on the silicon substrate 50 so that they have a shape (i.e., a substantially rectangular shape as viewed from above) corresponding to the absorption pattern 21A (see FIGS. 3 and 4). The size of the gate pattern 53 is reduced to approximately ¼ of the size of the absorption pattern 21A of the reflective mask 10 by reduction projection. That is, when the width L1 (see FIGS. 3 and 4) of the absorption pattern 21A is 88 nm, the width L4 (see FIG. 9C) of the gate pattern 53 is approximately 22 nm. After the gate pattern 53 and the gate insulation film 52 are formed, the resist pattern 54 is removed.

Next, a method for manufacturing the reflective mask 10 will now be described. Here, a method for forming the absorption pattern 21A and its peripheral structure (i.e., the recesses 13) will be described.

Figure 12A:
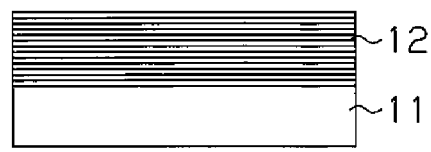
FIGS. 12A to 12E and 13A to 13E are schematic sectional views illustrating a method for manufacturing the reflective mask of FIG. 1.
Figure 12B:
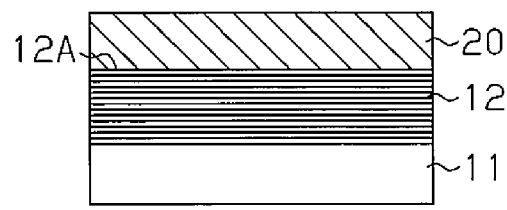

In the step illustrated in FIG. 12A, a structure formed by stacking a multilayer reflective film 12 on a substrate 11 is first prepared. For example, the multilayer reflective film 12, which has Mo and Si layers stacked in 40 cycles (pairs) and designed so that the reflectance of EUV light having a wavelength of 13.5 nm is to be approximately 60 to 70%, is formed on the substrate 11 by using a sputtering apparatus. Next, in the step illustrated in FIG. 12B, an absorption layer 20 is formed to cover the entire upper surface 12A of the multilayer reflective film 12. This forms a mask blank that is used to form the reflective mask 10. The absorption layer 20 may be formed by using, for example, the sputtering apparatus.

Figure 12C:
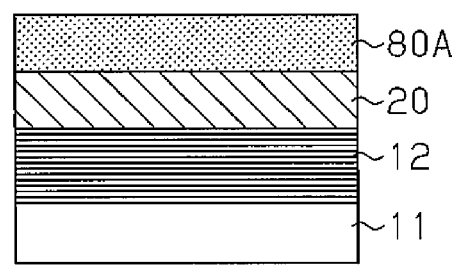

Next, in the step illustrated in FIG. 12C, an electron beam resist 80A, which is a chemically amplified resist, is formed to cover the entire upper surface of the absorption layer 20. For example, the electron beam resist 80A is formed by applying a liquid electron beam resist to the absorption layer 20 and performing a heating process.

Figure 12D:
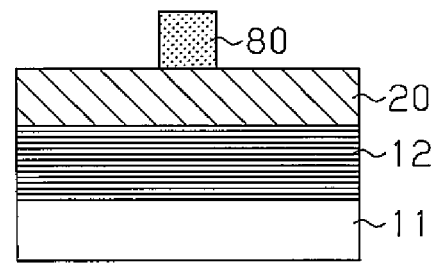

Next, an electron beam lithography apparatus is used to print a desired circuit pattern on the electron beam resist 80A with an electron beam. Then, by performing a post exposure bake (PEB) step and a development step, a resist pattern 80 is formed, as illustrated in FIG. 12D. In this manner, the resist pattern 80 is formed by electron beam lithography.

Figure 12E:
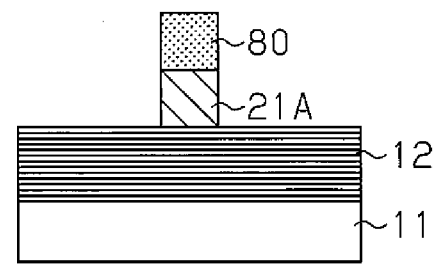

Next, by using the resist pattern 80 as an etching mask, the absorption layer 20 is etched. That is, the absorption layer 20, which is exposed from the resist pattern 80, is patterned by etching to have a given shape. This forms the absorption pattern 21A (circuit pattern) on the multilayer reflective film 12, as illustrated in FIG. 12E. Patterning of the absorption layer 20 may be performed by plasma etching using, for example, fluorine plasma or chlorine plasma, or both thereof if necessary.

Figure 13A:
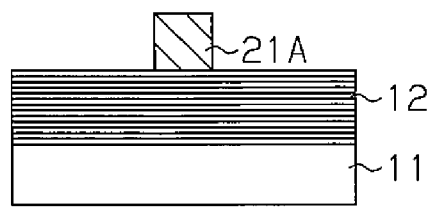
Figure 13B:
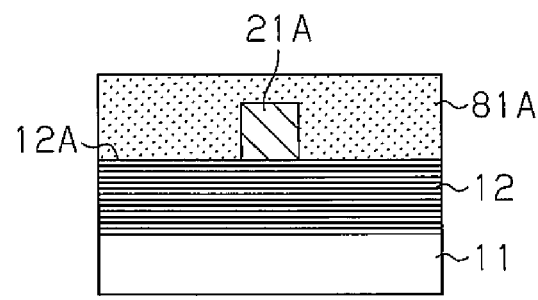
Figure 13C:
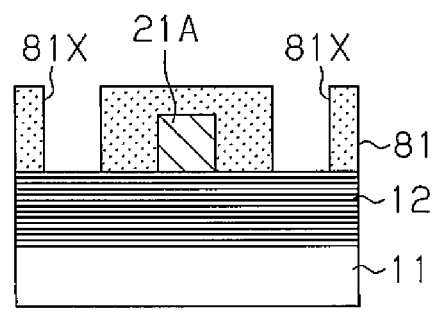

Next, in the step illustrated in FIG. 13A, the resist pattern 80 illustrated in FIG. 12E is removed by resist-removing cleaning. Then, in the step illustrated in FIG. 13B, by the same manufacturing step as the step illustrated in FIG. 12C, an electron beam resist 81A is formed to cover the entire upper surface 12A of the multilayer reflective film 12 and the absorption pattern 21A. Next, as illustrated in FIG. 13C, the electron beam resist 81A is patterned by electron beam lithography. This forms a resist pattern 81 which has openings 81X that expose the multilayer reflective film 12 at positions corresponding to the recesses 13.

Figure 13D:
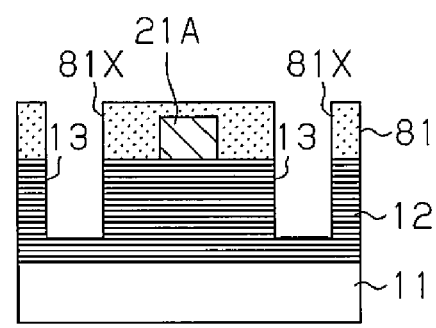

Next, in the step illustrated in FIG. 13D, by using the resist pattern 81 as an etching mask, the multilayer reflective film 12, that is, the Mo/Si multilayer film is reduced in thickness by etching. This forms the recesses 13 at given positions (the peripheral region of the absorption pattern 21A) of the multilayer reflective film 12. Reduction (formation of the recesses 13) in thickness of the multilayer reflective film 12 is performed so that a reflectance of EUV light having, for example, a wavelength of 13.5 nm is to be approximately 40 to 50%. Reduction in thickness of the multilayer reflective film 12 is performed by plasma etching using, for example, fluorine plasma or chlorine plasma, or both thereof if necessary.

Figure 13E:
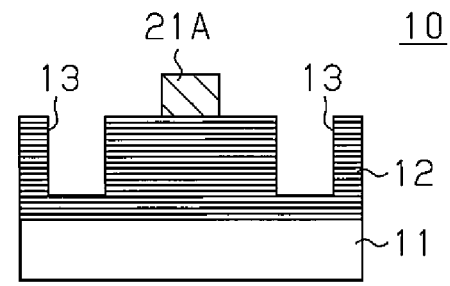

In the step illustrated in FIG. 13E, the resist pattern 81 illustrated in FIG. 13D is removed by resist-removing cleaning. By the manufacturing steps described above, the reflective mask 10 illustrated in FIG. 1 is formed.

Next, evaluation results of the reflective mask 10 will now be described with reference to FIGS. 14A to 14C and 15.

First, three masks, that is, a mask according to Example 1, a mask corresponding to Comparative Example 1, and a mask according to Comparative Example 2 were formed as samples for evaluation. As illustrated in FIG. 14A, the sample of Example 1 is a reflective mask 10 including an absorption pattern 21A and recesses 13. In the sample of Example 1, the width of the absorption pattern 21A was set to 88 nm (22 nm in the wafer scale), and the width of the recess 13 was set to 88 nm (22 nm in the wafer scale). Further, the recesses 13 were formed so that a reflectance of EUV light is 50%. As illustrated in FIG. 14B, the sample of Comparative Example 1 is a reflective mask 60A including a non-dense pattern 63 and auxiliary patterns 64. In the sample of Comparative Example 1, the width of the non-dense pattern 63 was set to 88 nm (22 nm in the wafer scale), and the width of the auxiliary pattern 64 was set to 40 nm (10 nm in the wafer scale). As illustrated in FIG. 14C, the sample of Comparative Example 2 is a reflective mask 60 including only a non-dense pattern 63 without including any auxiliary patterns 64 and any recesses 13. In the sample of Comparative Example 2, the width of the non-dense pattern 63 was set to 88 nm (22 nm in the wafer scale).

Figure 15:
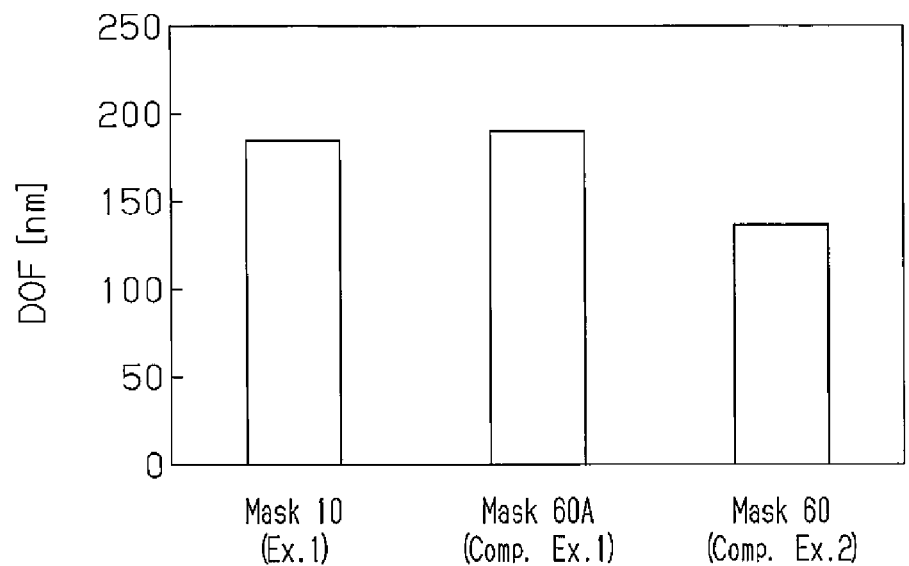
FIG. 15 is a graph illustrating results of simulation of a depth of focus.

Regarding the three samples, that is, the reflective masks 10, 60A, and 60, their optical intensity distributions were calculated in the same conditions. Simulation results of the optical intensity distributions are illustrated in FIGS. 14A to 14C. In the simulation results, each horizontal axis indicates a position, while each vertical axis indicates an optical intensity distribution. Further, for each of the reflective masks 10, 60A, and 60, by changing exposure amount and focus value and confirming such a focus range that 90% or greater of dimensions are obtained with respect to the resist dimensions at the best focus, the depths of focus of the reflective masks 10, 60A, and 60 were evaluated. The evaluation results are illustrated in FIG. 15. As illustrated in FIG. 15, the greater the value of the depth of focus, the greater the focus margin.

As is apparent from FIGS. 14A and 14B, the sample of Example 1 that includes the absorption pattern 21A and the recesses 13 has an optical intensity distribution equivalent to that of the sample of Comparative Example 1 that includes the non-dense pattern 63 and the auxiliary patterns 64. In addition, in the sample of Example 1, the positional relationship between an optical intensity peak corresponding to the absorption pattern 21A and optical intensity peaks corresponding to the recesses 13 is substantially the same as that between an optical intensity peak according to the non-dense pattern 63 and optical intensity peaks corresponding to the auxiliary patterns 64. Therefore, as illustrated in FIG. 15, the sample of Example 1 has a depth of focus that is substantially equal to that of the sample of Comparative Example 1. By comparing Example 1 and Comparative Example 1 with Comparative Example 2, it was confirmed that the arrangement of the recesses 13 (Example 1) or the auxiliary patterns 64 (Comparative Example 1) greatly increased (improved) the depth of focus, compared with the sample (Comparative Example 2) of no arrangement of the recesses 13 or the auxiliary patterns 64. In other words, it was confirmed that the formation of the recesses 13 caused an improvement advantage in depth of focus that is equivalent to that in the case of forming the auxiliary patterns 64.

Figure 16:
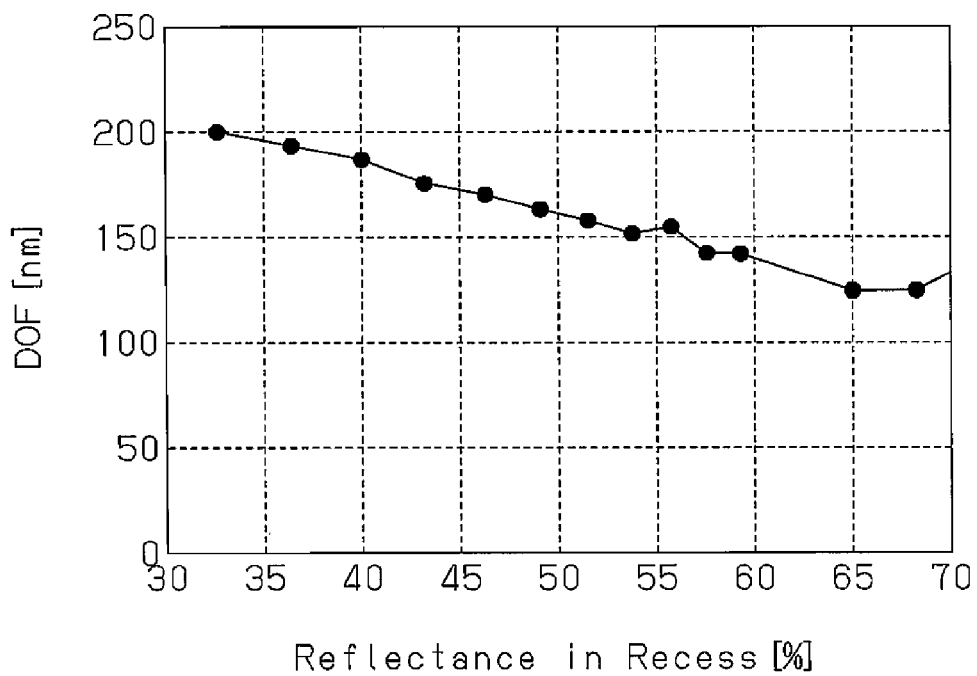
FIG. 16 is a graph illustrating the relationship between a depth of focus and a reflectance of a recess.

Next, results of evaluation of the relationship between the reflectance and depth of focus in the recess 13 will now be described. FIG. 16 illustrates results of measurement of the depth of focus obtained when the reflectance of the EUV light is changed in accordance with a change in depth of the recess 13. The depth of focus was measured in the absorption pattern 21A in the sample according to Example 1.

As illustrated in FIG. 16, the depth of focus was increased by forming the recesses 13 in the peripheral region of the absorption pattern 21A. Further, the smaller the reflectance in the recess 13, that is, the deeper the recess 13, the greater the depth of focus. For example, when the reflectance in the recess 13 is set to approximately 45%, the depth of focus may be increased to approximately 1.4 times the depth of focus obtained when the recess is not formed (when the reflectance is 70%).

However, when the reflectance in the recess 13 is too small, the recess 13 may be resolved depending on exposure conditions. In the example illustrated in FIG. 16, the recess 13 was resolved when the reflectance was lower than 40% to 43%. From the results of measurement, it is preferable that the reflectance in the recess 13 be equal to or greater than 40% and equal to or smaller than 50%. In particular, it is preferable that the reflectance in the recess 13 be equal to or greater than 45% and equal to or smaller than 50%. The reflectance in the recess 13 is set to an optimal value by finding a reflectance corresponding to a resolution limit of the recess 13 under certain conditions (such as exposure conditions and a mask structure) by an experiment, a simulation, or the like.

The present embodiment has the advantages described below.

(1) The recesses 13 are formed in the multilayer reflective film 12 exposed from the absorption pattern 21A in the peripheral region of the absorption pattern 21A. By forming the recesses 13, that is, reducing in thickness of the multilayer reflective film 12, the reflectance of the EUV light at the bottom 13A of the recess 13 (in the vicinity of the absorption pattern 21A) may be decreased. This makes it possible to obtain an optical intensity distribution including a first downwardly convex peak, which appears in correspondence with the absorption pattern 21A, and two second peaks, which appear on both sides of the first peak and are smaller than the first peak. The optical intensity distribution is similar to that obtained when the SRAF technology is applied. Thus, the depth of focus and the focus margin of the absorption pattern 21A may be increased as compared with when the recesses 13 or the auxiliary patterns 64 are not formed. This results in suppressing a variation in dimensions of a pattern (such as the resist pattern 41) when a variation in focus occurs.

(2) The planar shape (e.g., the width L2) of the recess 13 is formed so as to have a size identical to that of the planar shape (e.g., the width L1) of the absorption pattern 21A. This makes it possible to form the recesses 13 at processing accuracy equivalent to that in the case of processing the absorption pattern 21A. Further, the recesses 13 formed at such processing accuracy may increase the depth of focus and the focus margin of the absorption pattern 21A. In other words, at processing accuracy equivalent to that in the case of processing the absorption pattern 21A, the recesses 13 are formed. The recesses 13 have a function similar to that obtained when the SRAF technology is applied. Accordingly, even when the size of the absorption pattern 21A is small, the recesses 13 may preferably be formed. Further, an increase in manufacturing cost caused by forming the recesses 13 may preferably be reduced.

It should be apparent to those skilled in the art that the above embodiment may be embodied in many other specific forms without departing from the scope of the invention. Particularly, it should be understood that the above embodiment may be embodied in the following forms.

Figure 17:
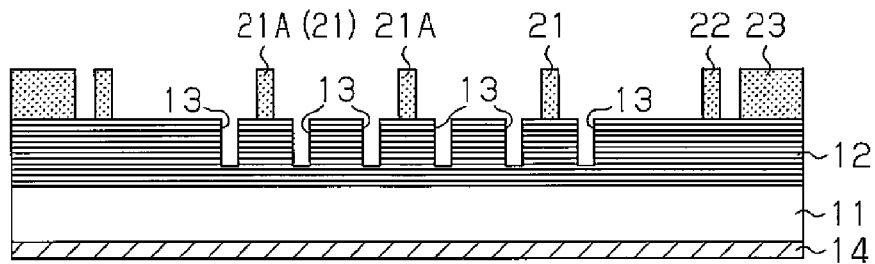
FIG. 17 is a schematic sectional view illustrating a reflective mask according to a modification.

As illustrated in FIG. 17, a conductive film 14 may be formed on a lower surface of a substrate 11. As a material for the conductive film 14, for example, chromium nitride (CrN) may be used. The conductive film 14 enables the electrostatic chuck to be used during exposure using the EUV light.

Figure 18:
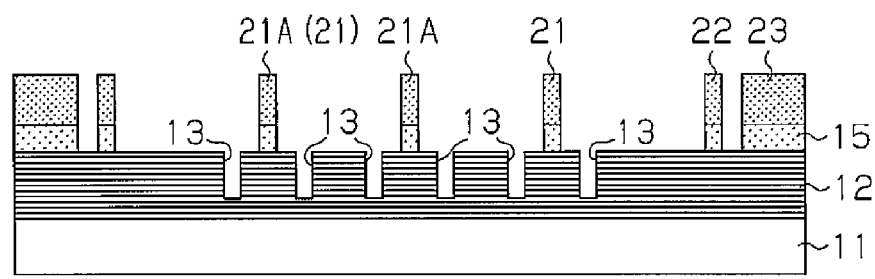
FIG. 18 is a schematic sectional view illustrating a reflective mask according to another modification.

As illustrated in FIG. 18, a buffer layer 15 may be formed between a multilayer reflective film 12 and absorption patterns 21 to 23. That is, the multilayer reflective film 12, the buffer layer 15, the absorption patterns 21, 22, and 23 may be stacked on a substrate 11 in this order. As the material for the buffer layer 15, for example, a material containing chromium may be used. The materials containing chromium include, for example, CrN, chromium oxide (CrO), chromium carbide (CrC), and chromium oxynitride (CrNO). The buffer layer 15 may protect the multilayer reflective film 12 formed below the buffer layer 15 when the absorption layer 20 is etched.

Figure 19:
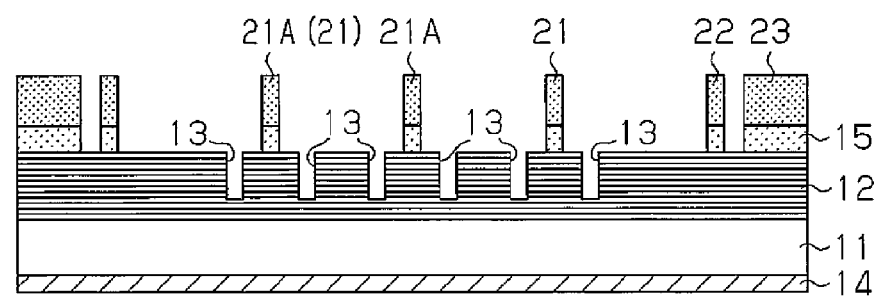
FIG. 19 is a schematic sectional view illustrating a reflective mask according to a further modification.

As illustrated in FIG. 19, the conductive film 14 may be formed on a lower surface of the substrate 11. In this case, the buffer layer 15 may be formed between the multilayer reflective film 12 and the absorption patterns 21 to 23.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments of the present invention have been described in detail, it should be understood that various changes, substitutions, and alterations could be made hereto without departing from the spirit and scope of the invention.

The invention claimed is:

1. A reflective mask comprising:
   a substrate;
   a multilayer reflective film formed on the substrate;
   an absorption pattern formed on the multilayer reflective film;
   an exposed surface portion of the multilayer reflective film formed in a peripheral region of the absorption pattern; and
   a recess formed in the multilayer reflective film in the peripheral region of the absorption pattern.

2. The reflective mask according to claim 1, wherein the recess has a planar shape identical to or larger than that of the absorption pattern.

3. The reflective mask according to claim 1, wherein the recess is configured to reflect extreme ultraviolet light at a reflectance of 40 to 50%.

4. The reflective mask according to claim 1, wherein the absorption pattern corresponds to a circuit pattern arranged at a pitch of 352 nm or greater.

5. The reflective mask according to claim 1, wherein the recess is spaced apart from the absorption pattern by a distance of 72 nm to 128 nm.

6. The reflective mask according to claim 1, wherein the substrate includes
   a circuit pattern region,
   a scribe region surrounding the circuit pattern region, and a shield region surrounding the scribe region, and
the absorption pattern and the recess are arranged in the circuit pattern region.

7. The reflective mask according to claim 1, further comprising
a further absorption pattern formed on the multilayer reflective film,
wherein the exposed surface portion of the multilayer reflective film is formed in a further peripheral region of the further absorption pattern.

8. The reflective mask according to claim 1, further comprising
a further recess formed in the multilayer reflective film in the peripheral region of the absorption pattern, wherein the further recess is located opposite to the recess with respect to the absorption pattern along a plane that is parallel to a normal of a surface of the substrate.

9. A method for manufacturing a reflective mask, comprising:
forming a multilayer reflective film on a substrate;
forming an absorption layer on the multilayer reflective film;
patterning the absorption layer to form an absorption pattern; and
forming a recess in the multilayer reflective film in a peripheral region of the absorption pattern such that an exposed surface portion of the multilayer reflective film is formed in the peripheral region of the absorption pattern.

* * * * *